United States Patent [19]

Swirhun

[11] Patent Number: 5,677,554

[45] Date of Patent: *Oct. 14, 1997

[54] FET HAVING A DIELECTRICALLY ISOLATED GATE CONNECT

[75] Inventor: Stanley E. Swirhun, Boulder, Colo.

[73] Assignee: Honeywell Inc., Minneapolis, Minn.

[*] Notice: The term of this patent shall not extend beyond the expiration date of Pat. No. 5,461,244.

[21] Appl. No.: 435,119

[22] Filed: May 5, 1995

Related U.S. Application Data

[62] Division of Ser. No. 177,087, Jan. 3, 1994, Pat. No. 5,455,183.

[51] Int. Cl.$^6$ ................................................. H01L 31/0328
[52] U.S. Cl. ........................... 257/192; 257/289; 257/776
[58] Field of Search ................................. 257/192, 280, 257/289, 775, 776

[56] References Cited

U.S. PATENT DOCUMENTS

| | | | |
|---|---|---|---|
| 5,124,762 | 6/1992 | Childs et al. | 257/289 |
| 5,461,244 | 10/1995 | Swirhun | 257/192 |

OTHER PUBLICATIONS (Fujitsu Ltd.) JP5206456, *Patent Abstracts of Japan*, vol. 17, No. 640 (E–1465), Aug. 13, 1993.

D.E. Grider et al., "A 4 Kbit Synchronous Static Random Access Memory Based Upon Delta–Doped Complementary Heterostructure Insulated Gate Field Effect Transistor Technology" Oct. 20–23, 1991, *Proceedings of the Gallium Arsenide Integrated Circuit Symposium* in Monterey, pp. 71–74.

A.I. Akinwande et al., "A Self–Aligned Gate III–V Heterostructure FET Process for Ultrahigh–Speed Digital and Mixed Analog/Digital LSI/VLSI Circuits," Oct. 1, 1989 *IEEE Transactions on Electron Devices*, vol. 36, No. 10, pp. 2204–2216.

S. Pearton et al. "Ion–beam–induced Intermixing of $Wsi_{0.45}$ and GaAs", Aug. 1989 *Materials Science & Engineering*, vol. B3, No. 3, pp. 273–277.

*Primary Examiner*—Mark V. Prenty
*Attorney, Agent, or Firm*—John G. Shudy, Jr.

[57] ABSTRACT

A HIGFET having a gate with a pad which is isolated from the FET heterostructure wafer by a dielectric layer to minimize leakage current between the gate and the wafer. The method of production of this device involves application of the gate metal only over the active area of the FET and a photo resist covering on the gate metal. The wafer, including the area covered by the photo resist, is covered with the dielectric layer. The photo resist layer is removed along with the dielectric layer from over the gate metal. Another layer of gate metal is formed on the preexisting gate metal including a gate pad on part of the remaining dielectric layer.

11 Claims, 8 Drawing Sheets

FET HAVING A DIELECTRICALLY ISOLATED GATE CONNECT

This applications is a division of application Ser. No. 08/177,087 filed Jan. 3, 1994 now U.S. Pat. No. 5,455,183.

BACKGROUND OF THE INVENTION

The invention pertains to the fabrication of field effect transistors (FETs), particularly heterostructure FETs (HFETs). More particularly, the invention is applicable to a device which is a heterostructure insulated gate (HIG) FET requiring a minimal leakage current between the gate pad and the remaining FET structure and a method for producing the device.

Physical contact between the gate pad and the heterostructure wafer of a HFET creates an undesirable high current leakage between the gate pad and the wafer. Since current leakage increases drastically with increased temperature, and results in high power consumption, minimized current leakage is essential for HFET operation at high temperatures.

SUMMARY OF THE INVENTION

The present invention has a dielectric interposed between the gate pad and the heterostructure wafer of a HFET, thus nearly eliminating the current leakage between the pad and the wafer. This minimized gate current leakage renders the HFET suitable for high temperature, low power operation.

DESCRIPTION OF THE EMBODIMENT

Figure 1:
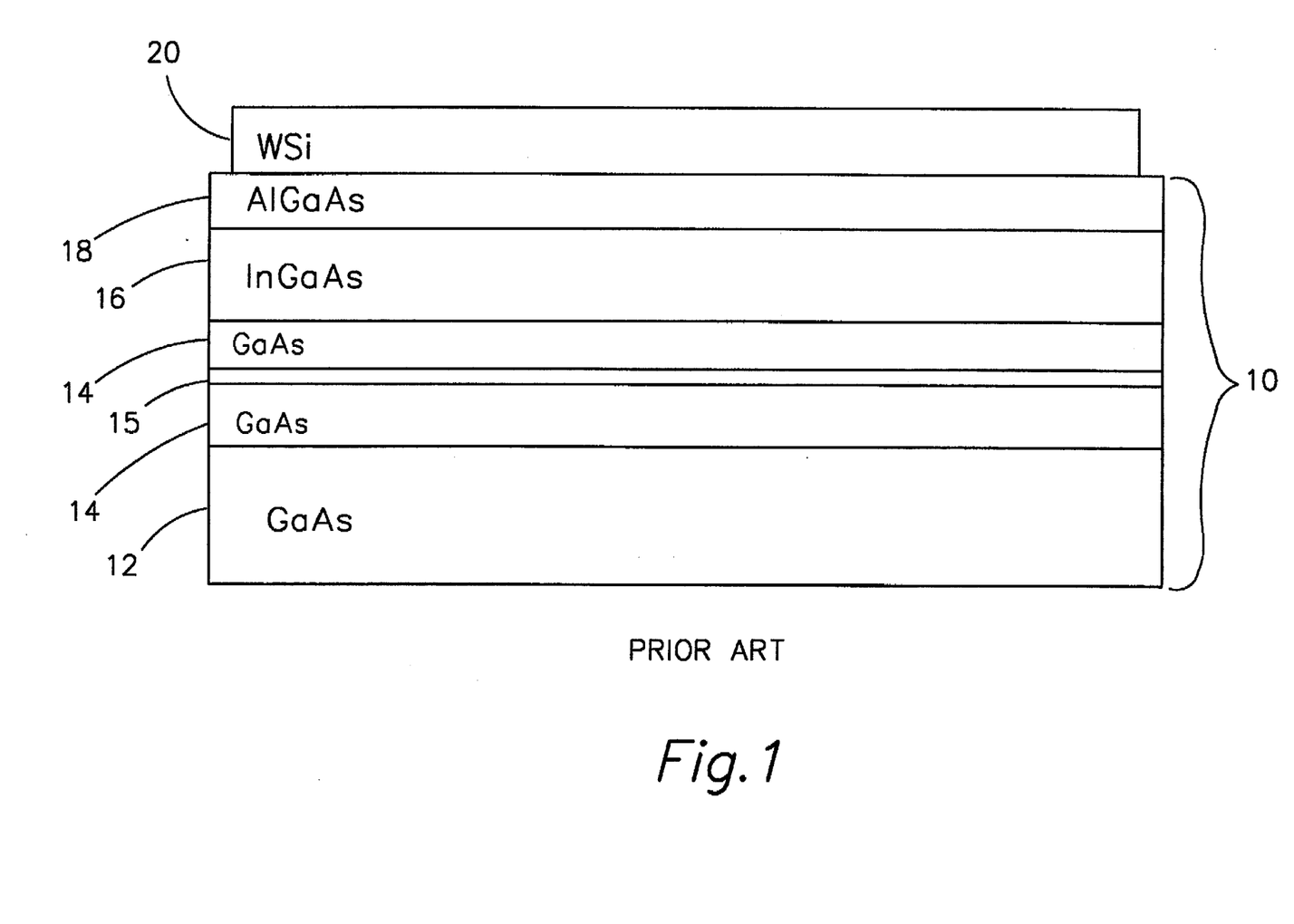
FIG. 1 is a cross-sectional view of a typical heterostructure wafer.

An insulated gate FET is fabricated on a heterostructure wafer 10 such as the one shown in figure 1. Wafer 10 is composed of a semi-insulating GaAs substrate 12, an unintentionally doped and therefore slightly less insulating GaAs buffer layer 14 with a "pulse" doping charge 15, an InGaAs channel layer 16, and an AlGaAs gate insulator layer 18. These layers, with the exception of layer 15, are not intentionally doped and have the attributes which are the same as those of layers typically used in the related art for desired purposes. Layer 18 of AlGaAs is typically from 100 to 500 angstroms thick; layer 16 of InGaAs is from 70 to 250 angstroms thick; and layer 14 of GaAs is from 1000 to 10,000 angstroms thick. Layer 15, a "pulse doped layer," is inserted into layer 14. Layer 15 is a "sheet" of dopant, typically Si, that is used to adjust the threshold of HIGFETs. Layer 15 is a fraction of a monolayer of Si dopant embedded in a single atomic layer. The typical dose of layer 15 is $1 \times 10^{11}$ to $1 \times 10^{12}$ per $cm^2$.

Figure 2:
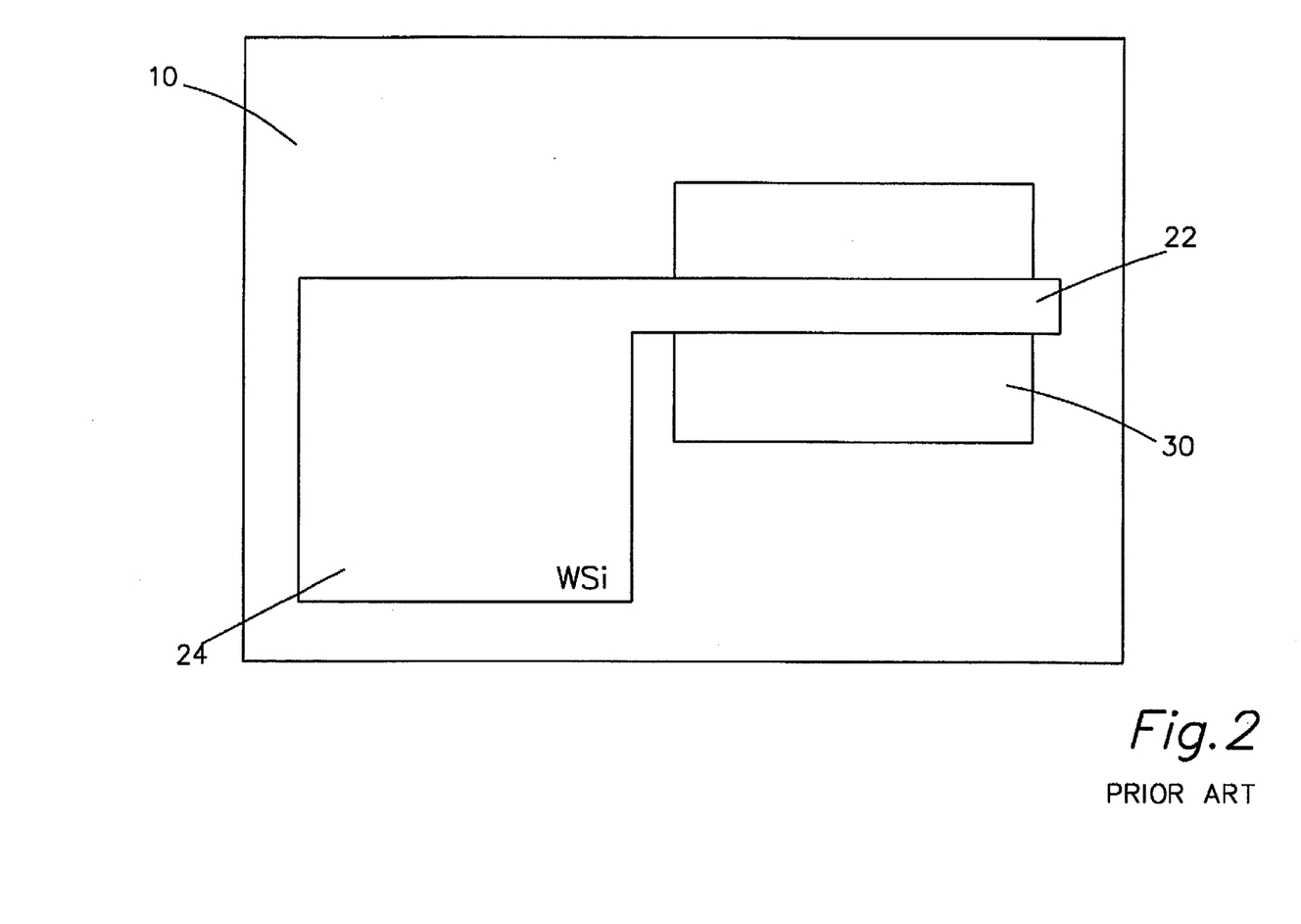
FIG. 2 is a plan view of a heterostructure FET.

In one method of HIGFET fabrication, heterostructure wafer 10 is covered with a layer 20 of gate metal, typically tungsten (W), and/or tungsten silicide (WSi), and/or tungsten nitride (WN). A typical thickness of layer 20 is 3000 to 10,000 angstroms for WSi or W or WN or a combination. In FIG. 2, gate metal layer 20 is patterned and etched to form a gate finger 22, typically measuring 0.8 micron by 3 microns. Gate finger 22 extends over active region 30 of the FET, and a gate pad 24, typically measuring at least 5 microns by 5 microns, which allows an upper layer metal or wire to electrically contact gate finger 22.

Figure 3:
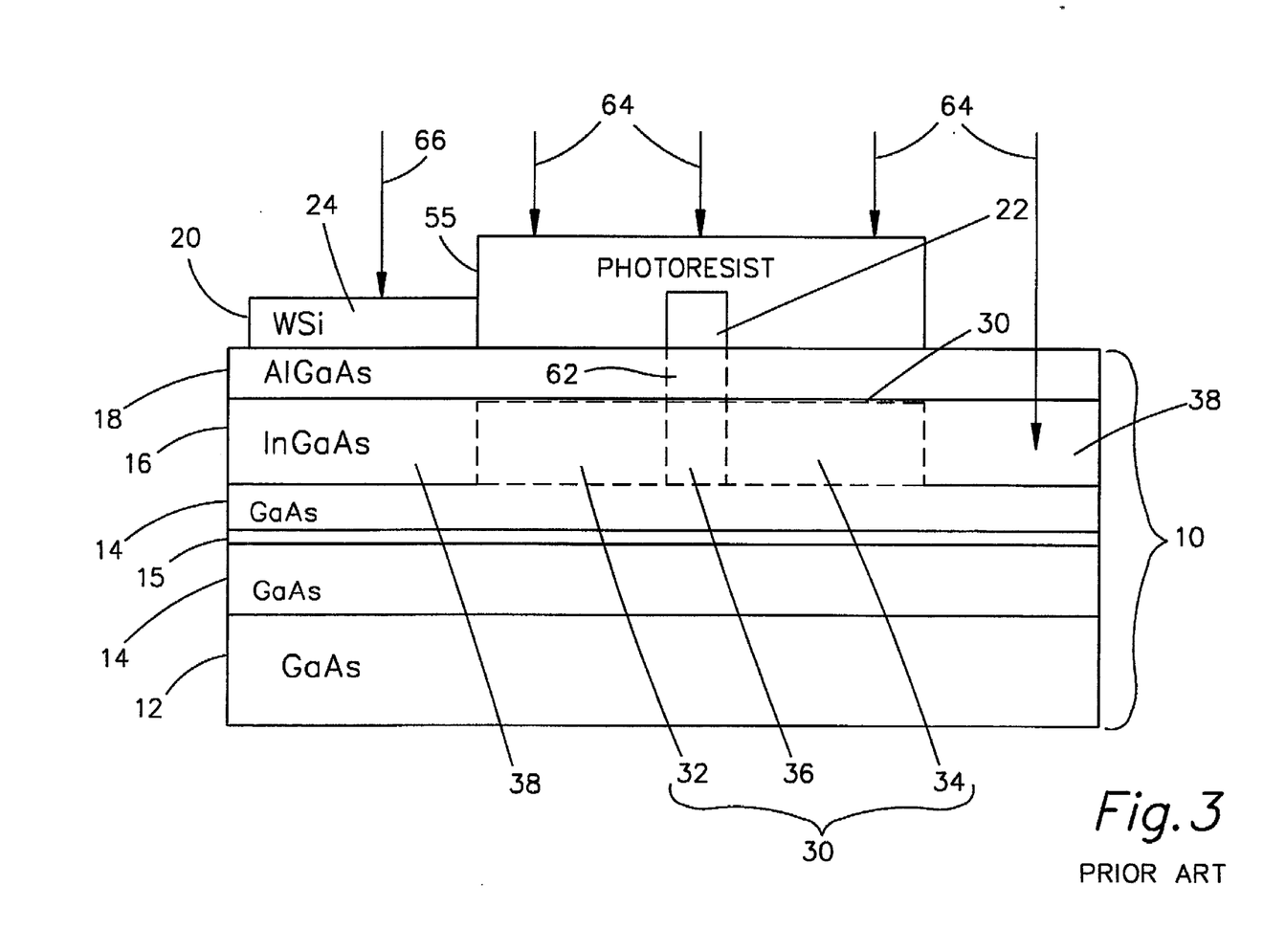
FIG. 3 shows a heterostructure FET of the related art.

In FIG. 3, after gate metal layer 20 has been patterned, ion implantation step, prior to forming photoresist layer 55, but using a photoresist layer on wafer 10 that covers all of wafer 10 except for the area that subsequent photoresist layer 55 covers, is used to form source region 32 and drain region 34 for horizontal conduction in channel layer 38, and source and drain contacts, respectively, for vertical conduction in layer 18 of the FET in a manner known in the art (e.g., silicon ions for an N-channel FET and beryllium ions for a P-channel FET). Ohmic contacts (not shown) are formed on the source and drain contacts of layer 18, also typical in the related art. Gate finger 22 blocks ion implantation over a channel region 36 of the FET, so that region 36 is not affected by the implantation and region 62 remains an insulator for gate 22. Channel region 36 is self-aligned to implanted source region 32 and drain region 34.

Next, active FET region 30 is masked by a photoresist layer 55, and wafer 10 is bombarded with high energy ions, such as oxygen, hydrogen or argon ions. This step, known as ion isolation implantation 64 and 66, damages channel layer regions 38 around active region 30, rendering regions 38 and 15 non conducting. Ion implantation makes the affected regions of layers 18, 16, 15 and 14 more non conducting. Incidentally, this implantation electrically isolates the FET from adjacent devices on wafer 10.

However, the ion isolation implantation 66 does not penetrate gate pad 24 because of its thickness; thus, the portion of channel layer 16 under gate pad 24 is not damaged and thereby electrically isolated from pad 24. Because this portion of channel layer 16 remains conductive and pulse dope layer 15 remains conductive, there is significant parasitic capacitance between gate pad 24 of metal layer 20 and channel layer 16 underneath gate pad 24, with layer 18 functioning as the capacitance dielectric. While high capacitance per unit area between gate finger 22 and channel 36 permits fast operation of the FET, high capacitance between gate pad 24 and channel layer 16 slows down FET operation and is undesirable. Another process of FET fabrication is one which permits ion isolation implantation of the channel layer beneath gate pad 24 without reducing transistor quality or significantly increasing the number of steps in the fabrication sequence.

A fabrication method that reduces gate pad 24 parasitic capacitance involves implanting the surface of the region of channel layer 16 beneath gate pad 24 before gate metal layer 20 is deposited. However, this method exposes wafer 10 to abuse and reduces the uniformity of structure and resulting performance among HFETs. This is because the heterostructure wafer layers are very thin, and the removal of even a few atomic layers from heterostructure wafer 10 negatively affects the HFETs produced thereon. Any process step (e.g., cleaning) which occurs before deposition of gate metal layer 20 results in the removal of some material from the surface of heterostructure wafer 10. Therefore, deposition of some kind of gate metal layer, which protects the surface of wafer 10 but is transparent to ion implantation, might be kept as a step before ion isolation implantation 64 and 66 in the fabrication process, after growing the layers of wafer 10.

Figure 4:
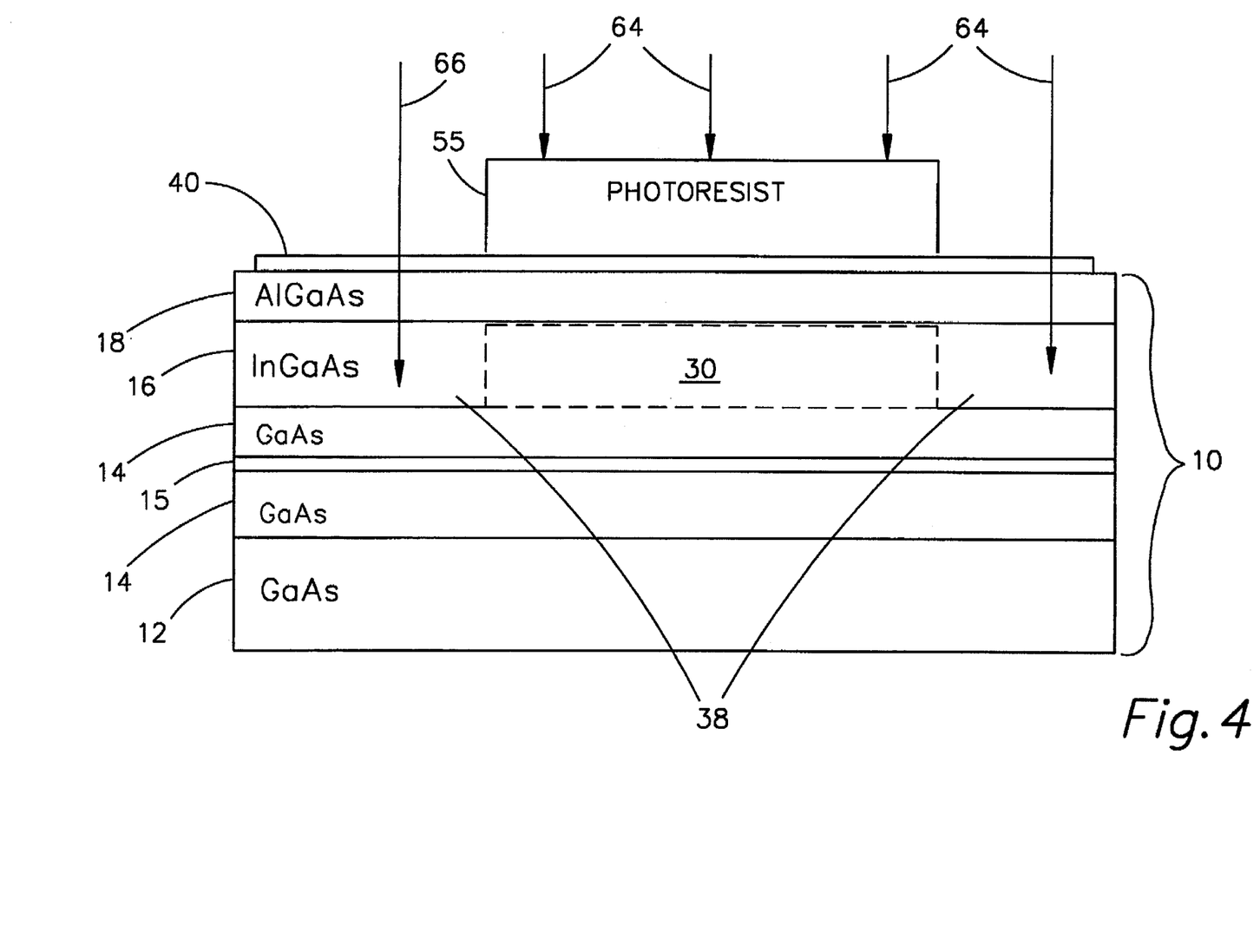
FIG. 4 shows an ion implantation through a thin gate metal layer.

FIG. 4 illustrates fabrication utilizing a thin gate layer 40. After the layers of heterostructure wafer 10 are grown, a gate metal (WSi) layer 40 is deposited. However, gate metal layer 40 is very thin (200–500 angstroms) so that the ions in the ion isolation implantation 66 can pass through it. Thin gate metal layer 40 serves to protect the surface of heterostructure wafer 10 while still allowing ion implantation 64 and 66 of the wafer. In other words, layer 40 is thin enough to pass ions but thick enough to protect the surface of wafer 10. Incidentally, thin layer 40 may be used to form other circuit elements such as "thin film" resistors or "metal-insulator-metal" capacitors.

But prior to ion isolation implantation 64 and 66, a photoresist layer 55 is deposited on gate metal layer 40 over active FET portion 30, before wafer 10 is implanted with ions for isolation of the FET. After implantation, channel layer regions 38 and pulse doped regions 15 which are not underneath photoresist layer 55 are damaged and therefore non conducting so as to prevent layer 18 being a parasitic capacitor in conjunction with metal layer 40.

Figure 5:
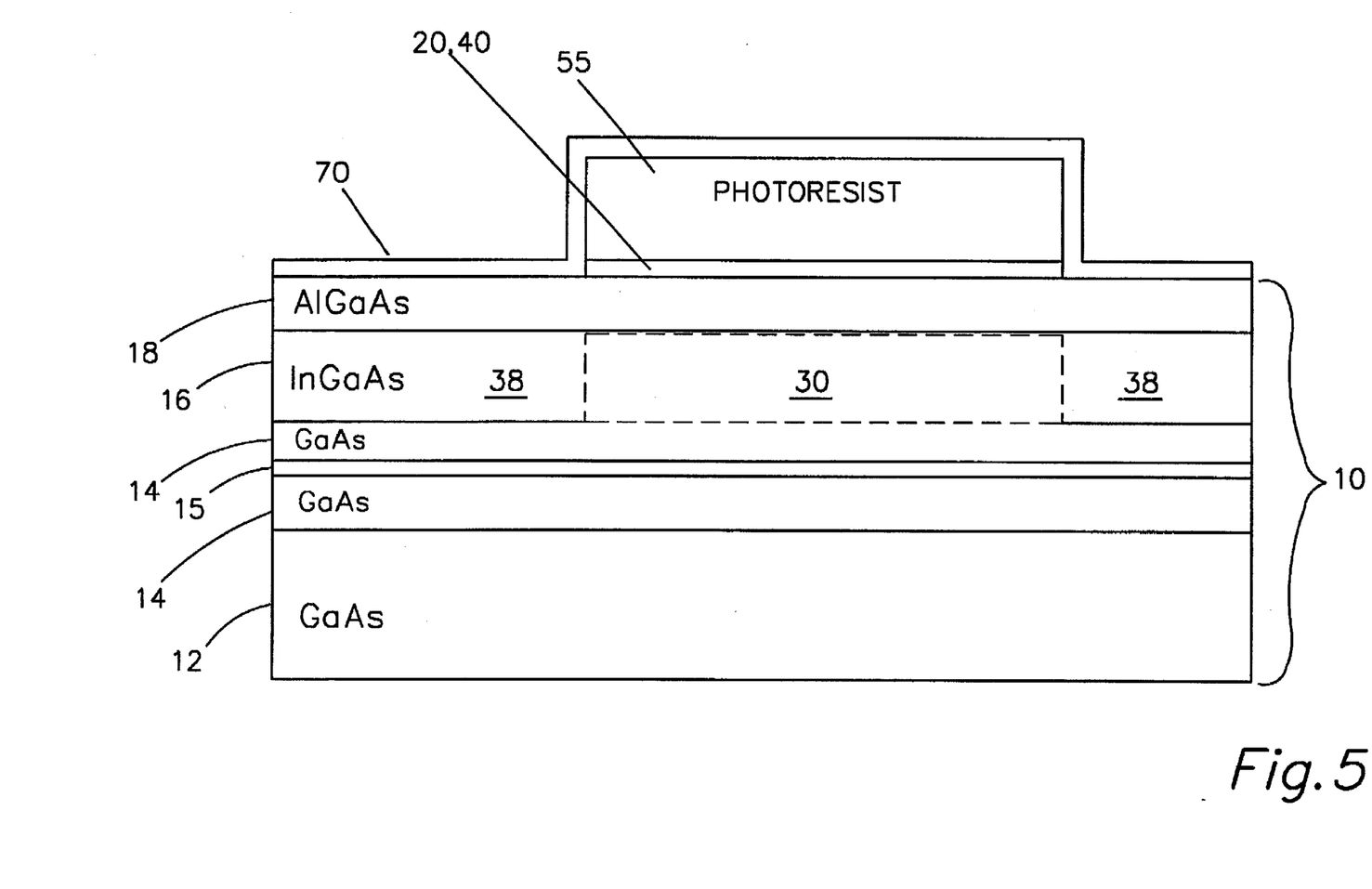
FIG. 5 illustrates the gate metal layer and the dielectric layer with the photoresist layer.

In FIG. 5, thin gate metal layer 40 is etched away except over active FET area 30. Photoresist layer 55 is formed over active FET area 30. A layer of dielectric 70, such as silicon nitride (SiN), is then deposited over wafer 10 and photoresist layer 55. Dielectric layer 70 is of approximately the same thickness as gate metal layer 40, which in the preferred embodiment is 200–500 angstroms, or as thick gate metal layer 20 of the related art.

Figure 6:
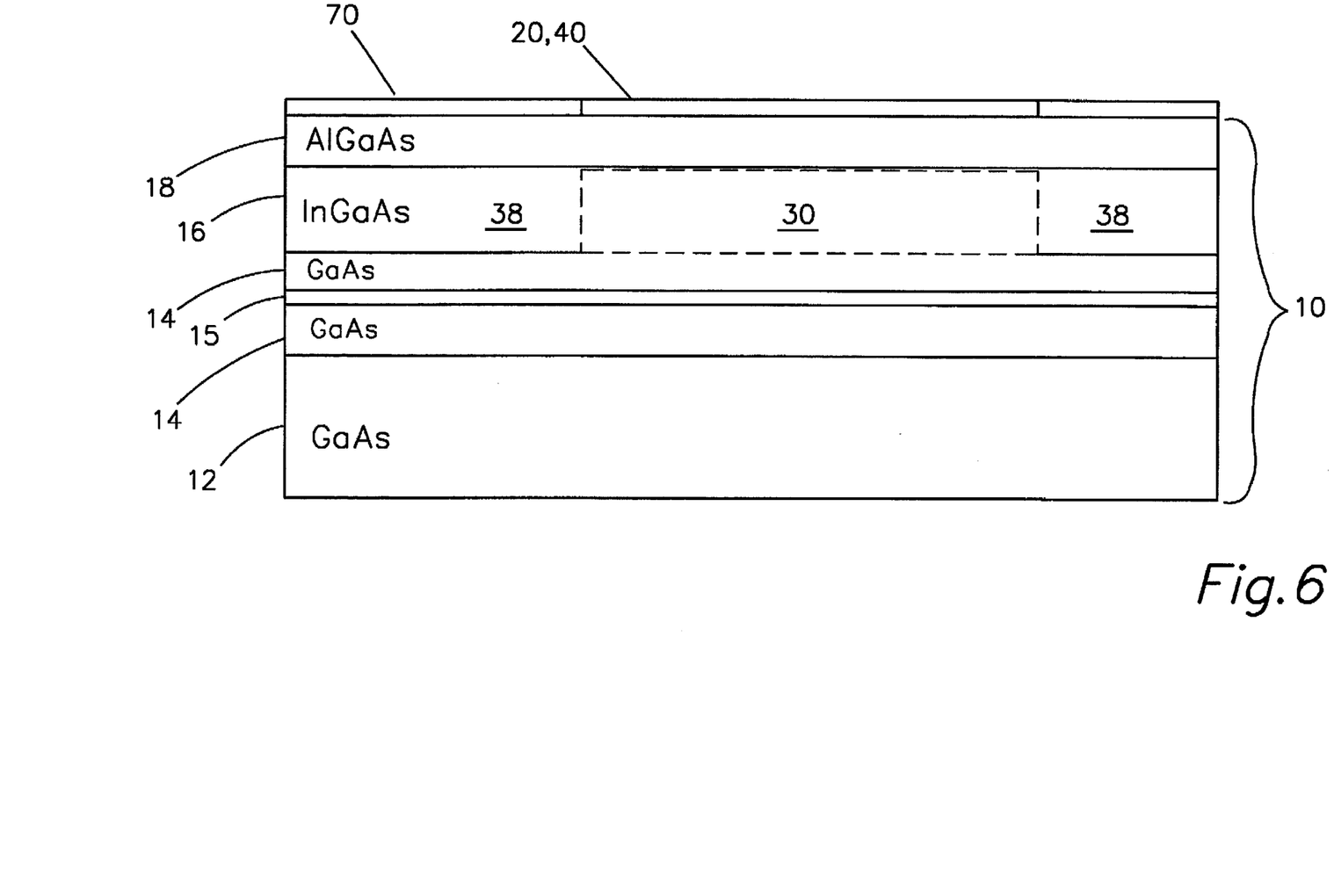
FIG. 6 is a sectional view that reveals the interrelationship of the gate metal and dielectric layers.
Figure 7:
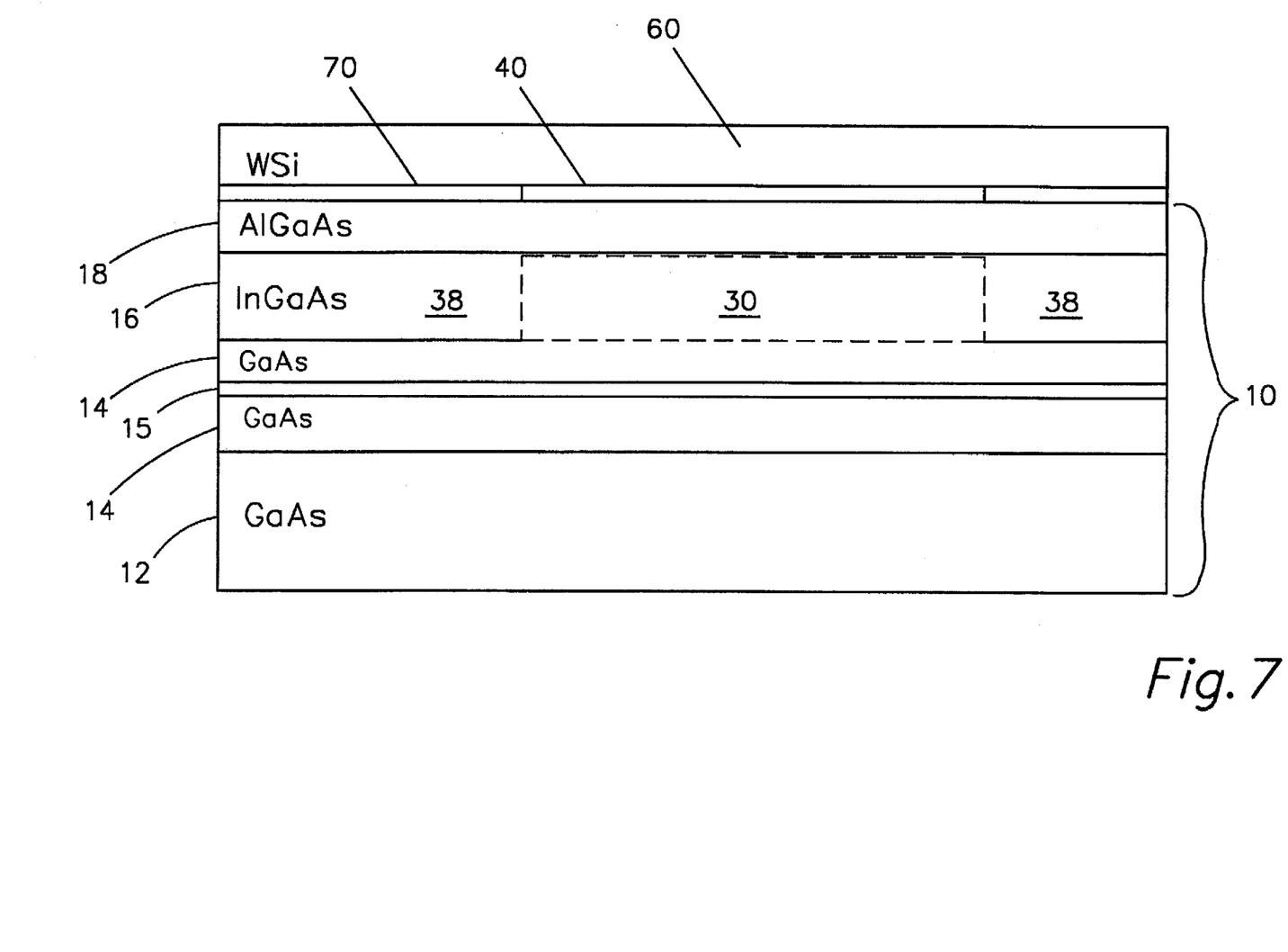
FIG. 7 shows an additional gate metal layer.

In FIG. 6, the photoresist layer 55 and dielectric 70 which covers layer 55 are then removed, leaving dielectric layer 70 covering all of the wafer other than the active area of the FET. The active area continues to be covered by thin gate metal layer 20 or 40. In FIG. 7 showing the embodiment having thin gate metal layer 40, a second gate metal layer 60, with a thickness of 2800–9500 angstroms (needed for adequate electrical conduction), is deposited on dielectric layer 70 and thin gate metal layer 40. The total minimum gate metal layer thickness is determined by the resistance of the gate finger; too much resistance means slow FET operation.

Figure 8:
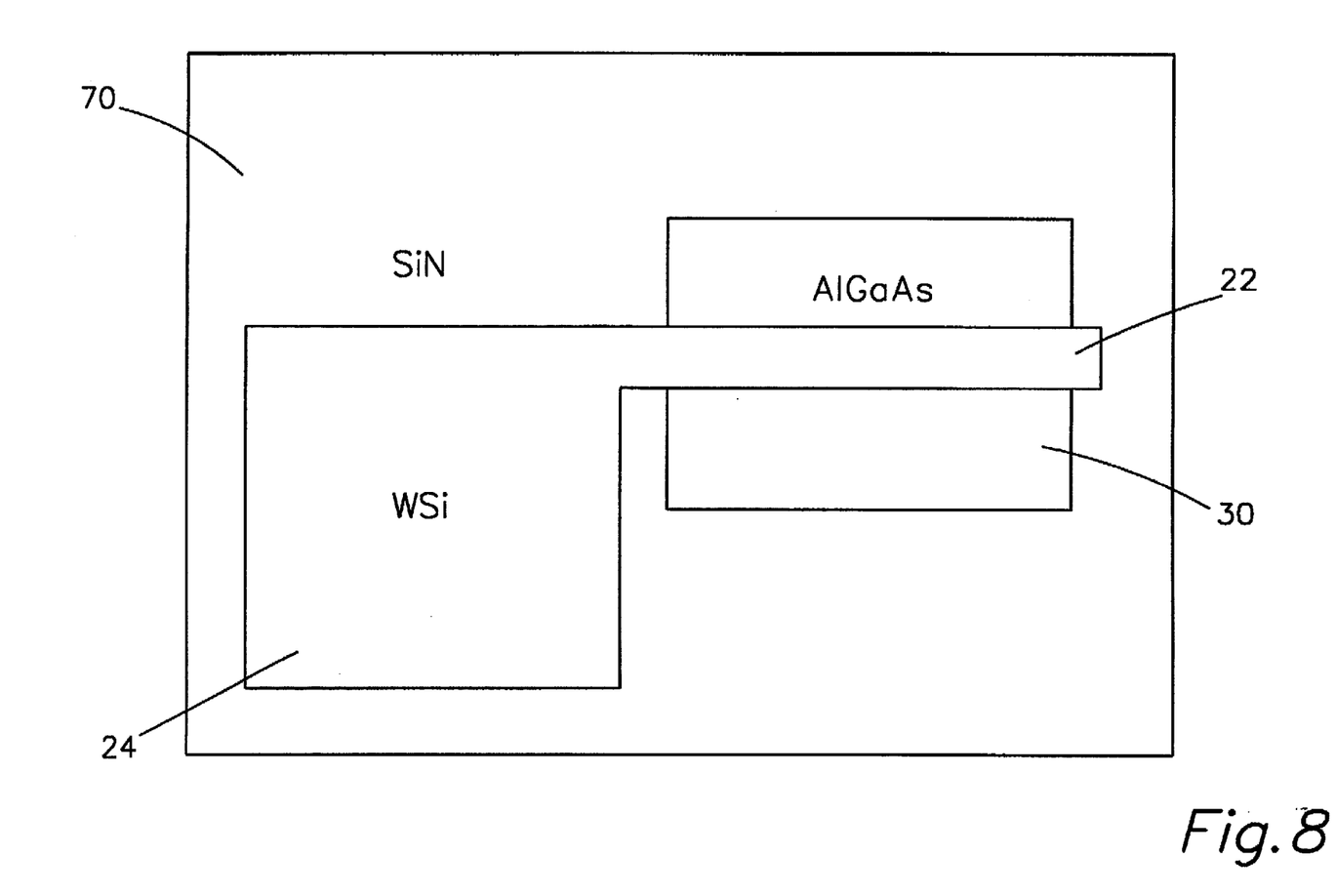
FIG. 8 is a plan view showing the relationship of the gate metal and dielectric layers.

The gate metal layers, 40 and 60 or 20, are then patterned and etched to form a gate pad 24 and a gate finger 22, as illustrated in FIG. 8. Gate pad 24 now rests upon dielectric layer 70, and not directly upon wafer 10. This nearly eliminates the current leakage between gate pad 24 and layer 18 of wafer 10.

What is claimed is:

1. A field effect transistor, having effectively neither parasitic capacitance nor current leakage between a gate and a heterostructure wafer of said field effect transistor, comprising:

a heterostructure wafer having a substrate, a buffer layer formed on the substrate, a channel layer formed on the buffer layer, and an insulator layer formed on the channel layer, wherein the channel layer has a first area incorporating source, gate and drain regions of said field effect transistor and has a second area mutually exclusive of the first area;

a first gate metal layer formed on the insulator layer over the first area of the channel layer;

the second area of the channel layer is implanted with ions and thus is non-conducting;

a dielectric layer is formed on the insulator layer over the second area of the channel layer; and a second gate metal layer is formed on the dielectric layer over the second area of the channel layer and on the first gate metal layer over the first area of the channel layer; and wherein:

the first and second gate metal layers have a shape of a gate pad on the dielectric layer over the second area of the channel layer and a gate finger on the insulator layer over the gate region of the first area of the channel layer; and the gate pad has effectively no parasitic capacitance between the gate pad and the channel layer and has effectively no leakage current between the gate pad and the insulator layer.

2. The transistor of claim 1 further comprising a pulse doped layer inserted in said buffer layer.

3. The transistor of claim 2 wherein:

the substrate is semi-insulating GaAs; the buffer layer is GaAs; the channel layer is InGaAs; the insulator layer is AlGaAs; and the first and second gate metal layers are at least one of the group consisting of W, WSi and WN.

4. The transistor of claim 3 wherein: the buffer layer has a thickness between $10^3$ and $10^4$ angstroms;

the channel layer has a thickness between 70 and 250 angstroms; and the insulator layer has a thickness between 100 and 500 angstroms.

5. The transistor of claim 4 wherein the total thickness of first and second gate metal layers is between 3000 and 10,000 angstroms.

6. The transistor of claim 5 wherein:

the first gate metal layer has a thickness between 200 and 500 angstroms; and the dielectric layer has a thickness between 200 and 500 angstroms.

7. The transistor of claim 6 wherein the thickness of the second gate metal layer is between 2800 and 9500 angstroms.

8. The transistor of claim 7 wherein the dielectric is silicon nitride.

9. The transistor of claim 8 wherein the pulse doped layer is a sheet of silicon dopant.

10. A field effect transistor comprising:

a channel layer, having a first portion incorporating drain, gate and source regions, and having a second portion mutually exclusive of the first portion, on a wafer having at least a substrate, wherein the second portion of said channel layer is ion-implanted and thus non-conducting;

an insulator layer on said channel layer;

a first gate metal layer on a first portion of said insulator layer situated on the first portion of said channel layer;

a dielectric layer formed on a second portion of said insulator layer situated on the second portion of said channel layer, wherein the second portion of said insulator layer is mutually exclusive of the first portion of said insulator layer; and a second gate metal layer formed on said dielectric layer and said first gate metal layer; and wherein:

said first and second gate metal layers on the first portion of said insulator layer, have a shape of a gate finger over the gate region of said channel layer; and said second gate metal layer formed on said dielectric layer has a shape of an interconnect pad for the gate finger.

11. A field effect transistor, having effectively neither parasitic capacitance nor current leakage, comprising:

a first GaAs buffer layer formed on a GaAs substrate;

a pulse doped layer formed on the first GaAs buffer layer;

a second GaAs buffer layer formed on the pulse doped layer, wherein the first and second GaAs buffer layers have a total thickness between 1000 and 10,000 angstroms;

an InGaAs channel layer, having a thickness between 70 and 250 angstroms, formed on the second GaAs buffer layer, wherein the InGaAs layer has a first portion that incorporates drain, gate and source regions, and has a second portion mutually exclusive of the first portion, and the second portion of the InGaAs channel layer is an ion-implanted insulator layer;

an AlGaAs insulator layer, having a thickness between 100 and 500 angstroms, having a first portion formed on the first portion of the InGaAs channel layer and a second portion formed on the second portion of the InGaAs channel layer;

a first gate metal layer, containing a material from a group consisting of W, WSi and WN, formed on the first portion of the AlGaAs insulator layer;

a dielectric layer, having a thickness between 200 and 500 angstroms, formed on the second portion of the AlGaAs insulator; and a second gate metal layer having a first portion formed on the first gate metal layer and a second portion formed on the dielectric layer, the first and second portions being mutually exclusive of each other said first and second gate metal layers having a combined thickness between 3000–10000 angstroms; and wherein the first portion of the second metal layer and the first gate metal layer, situated on the first portion of the AlGaAs insulator layer, have a shape of a gate finger over the gate region of the first portion of the InGaAs channel layer; and the second portion of the second gate metal layer, formed on the dielectric layer, has a shape of an interconnect gate pad and is connected to the gate finger; and the interconnect gate pad has effectively no parasitic capacitance with respect to the InGaAs channel layer or other layer and has effectively no leakage current to or from the AlGaAs insulator layer, the InGaAs channel layer, the second GaAs buffer layer, the pulse doped layer, the first GaAs buffer layer, and the GaAs substrate.

* * * * *